(12) United States Patent
Niclass et al.

(10) Patent No.: US 11,681,027 B2
(45) Date of Patent: *Jun. 20, 2023

(54) TIME-OF-FLIGHT DEPTH MAPPING WITH PARALLAX COMPENSATION

(71) Applicant: Apple Inc., Cupertino, CA (US)

(72) Inventors: Cristiano L. Niclass, San Jose, CA (US); Scott T. Smith, San Jose, CA (US); Thierry Oggier, San Jose, CA (US)

(73) Assignee: APPLE INC., Cupertino, CA (US)

( * ) Notice: Subject to any disclaimer, the term of this patent is extended or adjusted under 35 U.S.C. 154(b) by 283 days.

This patent is subject to a terminal disclaimer.

(21) Appl. No.: 17/026,365

(22) Filed: Sep. 21, 2020

(65) Prior Publication Data

US 2021/0003680 A1      Jan. 7, 2021

Related U.S. Application Data

(63) Continuation of application No. 15/950,186, filed on Apr. 11, 2018, now Pat. No. 10,830,879.

(Continued)

(51) Int. Cl.
*G01C 3/08* (2006.01)
*G01S 7/4865* (2020.01)
(Continued)

(52) U.S. Cl.
CPC .......... *G01S 7/4865* (2013.01); *G01S 7/4863* (2013.01); *G01S 17/10* (2013.01); *G01S 17/42* (2013.01);

(Continued)

(58) Field of Classification Search
None
See application file for complete search history.

(56) References Cited

U.S. PATENT DOCUMENTS 5,373,148 A    12/1994  Dvorkis et al.
7,800,739 B2   9/2010   Rohner et al.
(Continued)

FOREIGN PATENT DOCUMENTS

CA    2605339 C     10/1994
CN    201054040 Y   4/2008
(Continued)

OTHER PUBLICATIONS

JP Application # 2020001203 Office Action dated Feb. 4, 2021.
(Continued)

*Primary Examiner* — Mark Hellner
(74) *Attorney, Agent, or Firm* — Kligler & Associates Patent Attorneys Ltd

(57) ABSTRACT

An optical sensing device includes a light source, which is configured to emit one or more beams of light pulses at respective angles toward a target scene. An array of sensing elements is configured to output signals in response to incidence of photons on the sensing elements. Light collection optics are configured to image the target scene onto the array. Control circuitry is coupled to actuate the sensing elements only in one or more selected regions of the array, each selected region containing a respective set of the sensing elements in a part of the array onto which the light collection optics image a corresponding area of the target scene that is illuminated by the one of the beams, and to adjust a membership of the respective set responsively to a distance of the corresponding area from the device.

17 Claims, 5 Drawing Sheets

Related U.S. Application Data

(60) Provisional application No. 62/526,375, filed on Jun. 29, 2017.

(51) Int. Cl.
*G01S 7/4863* (2020.01)
*G01S 17/10* (2020.01)
*H01L 31/107* (2006.01)
*H01L 27/144* (2006.01)
*G01S 17/89* (2020.01)
*G01S 17/42* (2006.01)

(52) U.S. Cl.
CPC .......... *G01S 17/89* (2013.01); *H01L 27/1443* (2013.01); *H01L 31/107* (2013.01)

(56) References Cited

U.S. PATENT DOCUMENTS

| | | |
|---|---|---|
| 8,279,418 B2 | 10/2012 | Yee et al. |
| 8,594,425 B2 | 11/2013 | Gurman et al. |
| 8,891,068 B2 | 11/2014 | Eisele et al. |
| 9,267,787 B2 | 2/2016 | Shpunt et al. |
| 9,335,220 B2 | 5/2016 | Shpunt et al. |
| 9,354,332 B2 | 5/2016 | Zwaans et al. |
| 9,465,111 B2 | 10/2016 | Wilks et al. |
| 9,761,049 B2 | 9/2017 | Naegle et al. |
| 9,786,701 B2 | 10/2017 | Mellot et al. |
| 10,067,224 B2 | 9/2018 | Moore et al. |
| 10,269,104 B2 | 4/2019 | Hannuksela et al. |
| 10,424,683 B1 | 9/2019 | Do Valle et al. |
| 10,613,203 B1 | 4/2020 | Rekow et al. |
| 10,782,393 B2 | 9/2020 | Dussan et al. |
| 2002/0154054 A1 | 10/2002 | Small |
| 2004/0212863 A1 | 10/2004 | Schanz et al. |
| 2006/0044546 A1 | 3/2006 | Lewin et al. |
| 2011/0006190 A1 | 1/2011 | Alameh et al. |
| 2012/0154542 A1 | 6/2012 | Katz et al. |
| 2013/0107016 A1 | 5/2013 | Federspiel |
| 2014/0027606 A1 | 1/2014 | Raynor et al. |
| 2014/0071433 A1* | 3/2014 | Eisele .................. G01S 7/4914 356/5.01 |
| 2014/0162714 A1 | 6/2014 | Kim et al. |
| 2014/0240691 A1 | 8/2014 | Mheen et al. |
| 2014/0300907 A1 | 10/2014 | Kimmel |
| 2015/0062558 A1 | 3/2015 | Koppal et al. |
| 2015/0260830 A1 | 9/2015 | Ghosh et al. |
| 2015/0362585 A1 | 12/2015 | Ghosh et al. |
| 2015/0373322 A1 | 12/2015 | Goma et al. |
| 2016/0072258 A1 | 3/2016 | Seurin et al. |
| 2016/0334508 A1 | 11/2016 | Hall et al. |
| 2016/0344965 A1 | 11/2016 | Grauer |
| 2017/0006278 A1 | 1/2017 | Vandame et al. |
| 2017/0139041 A1 | 5/2017 | Drader et al. |
| 2017/0184704 A1 | 6/2017 | Yang et al. |
| 2017/0242108 A1* | 8/2017 | Dussan .................. G01S 7/4868 |
| 2017/0343675 A1 | 11/2017 | Oggier et al. |
| 2018/0115762 A1 | 4/2018 | Bulteel et al. |
| 2018/0205943 A1* | 7/2018 | Trail .......................... G06T 7/50 |
| 2018/0209846 A1 | 7/2018 | Mandai et al. |
| 2018/0259645 A1 | 9/2018 | Shu et al. |
| 2018/0341009 A1* | 11/2018 | Niclass .................. G01S 7/4817 |
| 2019/0011556 A1 | 1/2019 | Pacala et al. |
| 2019/0018117 A1 | 1/2019 | Perenzoni et al. |
| 2019/0018119 A1 | 1/2019 | Laifenfeld et al. |
| 2019/0018143 A1 | 1/2019 | Thayer et al. |
| 2019/0037120 A1 | 1/2019 | Ohki |
| 2019/0178995 A1 | 6/2019 | Tsai et al. |
| 2019/0257950 A1 | 8/2019 | Patanwala et al. |
| 2019/0277952 A1 | 9/2019 | Beuschel et al. |
| 2019/0361404 A1 | 11/2019 | Mautner et al. |
| 2020/0142033 A1 | 5/2020 | Shand |
| 2020/0233068 A1 | 7/2020 | Henderson et al. |
| 2020/0314294 A1 | 10/2020 | Schoenlieb et al. |
| 2020/0386890 A1 | 10/2020 | Oggier et al. |

FOREIGN PATENT DOCUMENTS

| | | | |
|---|---|---|---|
| CN | 104730535 A | 6/2015 | |
| CN | 105066953 | * 11/2015 | .......... G01C 15/002 |
| CN | 105992960 A | 10/2016 | |
| CN | 110609293 A | 12/2019 | |
| EP | 2322953 A1 | 5/2011 | |
| EP | 2469297 A1 | 6/2012 | |
| EP | 3521856 A1 | 8/2019 | |
| JP | H02287113 A | 11/1990 | |
| JP | H0567195 A | 3/1993 | |
| JP | H10170637 A | 6/1998 | |
| JP | H11063920 A | 3/1999 | |
| JP | 2011237215 A | 11/2011 | |
| JP | 2013113669 A | 6/2013 | |
| KR | 101318951 B1 | 10/2013 | |
| WO | 9008946 A1 | 8/1990 | |
| WO | 2012154356 A1 | 11/2012 | |
| WO | 2013028691 A1 | 2/2013 | |
| WO | 2017106875 A1 | 6/2017 | |
| WO | 2018122560 A1 | 7/2018 | |
| WO | 2020101576 A1 | 5/2020 | |
| WO | 2020109378 A1 | 6/2020 | |
| WO | 2020201452 A1 | 10/2020 | |

OTHER PUBLICATIONS

U.S. Appl. No. 16/752,653 Office Action dated Feb. 4, 2021.
CN Application #201680074428.8 Office Action dated Jun. 23, 2021.
Zhu Jian, "Research of Simulation of Super-Resolution Reconstruction of Infrared Image", abstract page, Master's Thesis, p. 1, Nov. 15, 2005.
International Application # PCT/US2020/058760 Search Report dated Feb. 9, 2021.
TW Application # 109119267 Office Action dated Mar. 10, 2021.
U.S. Appl. No. 16/752,653 Office Action dated Apr. 5, 2021.
U.S. Appl. No. 16/679,360 Office Action dated Jun. 29, 2022.
EP Application # 22167103.5 Search Report dated Jul. 11, 2022.
CN Application # 201780058088.4 Office Action dated Aug. 23, 2022.
U.S. Appl. No. 16/885,316 Office Action dated Jun. 30, 2022.
U.S. Appl. No. 16/532,513 Office Action dated Aug. 4, 2022.
U.S. Appl. No. 16/532,517 Office Action dated Oct. 14, 2020.
EP Application # 20177707.5 Search Report dated Nov. 12, 2020.
U.S. Appl. No. 16/752,653 Office Action dated Oct. 1, 2021.
EP Application # 17737420.4 Office Action dated Oct. 28, 2021.
KR Application # 1020200068248 Office Action dated Nov. 12, 2021.
KR Application # 1020207015906 Office Action dated Oct. 13, 2021.
CN Application # 201810571820.4 Office Action dated Sep. 9, 2022.
KR Application # 1020220101419 Office Action dated Sep. 28, 2022.
U.S. Appl. No. 16/532,513 Office Action dated Nov. 23, 2022.
IN Application # 202117029897 Office Action dated Mar. 10, 2022.
IN Application # 202117028974 Office Action dated Mar. 2, 2022.
U.S. Appl. No. 17/079,548 Office Action dated Mar. 3, 2023.
CN Application #201780097602.5 Office Action dated Mar. 15, 2023.
CN Application #202010063812.6 Office Action dated Mar. 18, 2023.
KR Application # 1020217025136 Office Action dated Apr. 4, 2023.

* cited by examiner

TIME-OF-FLIGHT DEPTH MAPPING WITH PARALLAX COMPENSATION

CROSS-REFERENCE TO RELATED APPLICATION

This application is a continuation of U.S. patent application Ser. No. 15/950,186, filed Apr. 11, 2018, which claims the benefit of U.S. Provisional Patent Application 62/526,375, filed Jun. 29, 2017, which is incorporated herein by reference.

FIELD OF THE INVENTION

The present invention relates generally to depth mapping, and particularly to devices and methods for depth mapping based on sensing of time of flight (ToF).

BACKGROUND

Time-of-flight (ToF) imaging techniques are used in many depth mapping systems (also referred to as 3D mapping or 3D imaging systems). In direct ToF techniques, a light source, such as a pulsed laser, directs pulses of optical radiation toward the scene that is to be mapped, and a high-speed detector senses the time of arrival of the radiation reflected from the scene. (The terms "light" and "illumination," as used in the context of the present description and in the claims, refer to optical radiation in any or all of the visible, infrared and ultraviolet ranges.) The depth value at each pixel in the depth map is derived from the difference between the emission time of the outgoing pulse and the arrival time of the reflected radiation from the corresponding point in the scene, which is referred to as the "time of flight" of the optical pulses. The radiation pulses that are reflected back and received by the detector are also referred to as "echoes."

Some ToF-based depth mapping systems use detectors based on single-photon avalanche diode (SPAD) arrays. SPADs, also known as Geiger-mode avalanche photodiodes (GAPDs), are detectors capable of capturing individual photons with very high time-of-arrival resolution, of the order of a few tens of picoseconds. They may be fabricated in dedicated semiconductor processes or in standard CMOS technologies. Arrays of SPAD sensors, fabricated on a single chip, have been used experimentally in 3D imaging cameras. Charbon et al. provide a review of SPAD technologies in "SPAD-Based Sensors," published in *TOF Range-Imaging Cameras* (Springer-Verlag, 2013).

For efficient detection, SPAD arrays may be integrated with dedicated processing circuits. For example, U.S. Patent Application Publication 2017/0052065, whose disclosure is incorporated herein by reference, describes a sensing device that includes a first array of sensing elements (such as SPADs), which output a signal indicative of a time of incidence of a single photon on the sensing element. A second array of processing circuits are coupled respectively to the sensing elements and comprise a gating generator, which variably sets a start time of the gating interval for each sensing element within each acquisition period, and a memory, which records the time of incidence of the single photon on each sensing element in each acquisition period. A controller processes a histogram of respective counts over different time bins for each sensing element so as to derive and output a respective time-of-arrival value for the sensing element.

SUMMARY

Embodiments of the present invention that are described hereinbelow provide improved devices and methods for ToF-based depth mapping.

There is therefore provided, in accordance with an embodiment of the invention, an optical sensing device, including a light source, which is configured to emit one or more beams of light pulses at respective angles toward a target scene. An array of sensing elements is configured to output signals in response to incidence of photons on the sensing elements. Light collection optics are configured to image the target scene onto the array. Control circuitry is coupled to actuate the sensing elements only in one or more selected regions of the array, each selected region containing a respective set of the sensing elements in a part of the array onto which the light collection optics image a corresponding area of the target scene that is illuminated by the one of the beams, and to adjust a membership of the respective set responsively to a distance of the corresponding area from the device.

In the disclosed embodiments, the signals output by the sensing elements are indicative of respective times of arrival of the photons on the sensing elements, and the control circuitry is configured to process the signals in order to compute an indication of the distance to the corresponding area in the target scene based on the times of arrival. In one embodiment, the sensing elements include single-photon avalanche diodes (SPADs). Additionally or alternatively, the control circuitry is configured to bin together the signals that are output by the sensing elements in the set in order to compute an average time of flight of the photons over the set.

In a disclose embodiment, the light source includes a plurality of emitters, which are configured to emit a corresponding plurality of the beams concurrently toward different, respective areas of the target scene.

In one embodiment, the control circuitry is configured to enlarge the selected region of the array responsively to the distance, such that the selected region contains a larger number of the sensing elements when the corresponding area is close to the device than when the corresponding area is far from the device.

Additionally or alternatively, the device is configured to sense the photons received from the target scene over a range of distances from a minimal range to a maximal range, and the control circuitry is configured to set a size of the selected region to be sufficient to contain a first image cast onto the array by the light collection optics of the corresponding area of the scene at the maximal range, but smaller than a second image cast onto the array by the light collection optics of the corresponding area of the scene at the minimal range.

There is also provided, in accordance with an embodiment of the invention, an optical sensing device, including a light source, which is configured to emit one or more beams of light pulses along a transmit axis toward a target scene. An array of sensing elements is configured to output signals in response to incidence of photons on the sensing elements. Light collection optics are configured to image the target scene onto the array along a receive axis, which is offset transversely relative to the transmit axis. Control circuitry is coupled to actuate the sensing elements only in one or more selected regions of the array, each selected region containing a respective set of the sensing elements in a part of the array onto which the light collection optics image a corresponding area of the target scene that is illuminated by the one of the beams, while setting a boundary of the selected region responsively to a parallax due to the offset between the transmit and receive axes.

In a disclosed embodiment, the control circuitry is configured to shift a boundary of the selected region of the array as responsively to a distance of the corresponding area from the device in order to compensate for the parallax.

Additionally or alternatively, the device is configured to sense the photons received from the target scene over a range of distances from a minimal range to a maximal range, such that a first image cast onto the array by the light collection optics of the corresponding area of the scene at the maximal range is shifted transversely, due to the parallax, relative to a second image cast onto the array by the light collection optics of the corresponding area of the scene at the minimal range. The control circuitry is configured to set the boundary of the selected region to contain all of the first image but only a part of the second image.

There is additionally provided, in accordance with an embodiment of the invention, a method for optical sensing, which includes emitting one or more beams of light pulses at respective angles toward a target scene. The target scene is imaged onto an array of sensing elements configured to output signals in response to incidence of photons on the sensing elements. The sensing elements are actuated only in one or more selected regions of the array, each selected region containing a respective set of the sensing elements in a part of the array onto which a corresponding area of the target scene that is illuminated by the one of the beams is imaged. A membership of the respective set is adjusted responsively to a distance of the corresponding area from the array.

In some embodiments, the one or more beams are emitted along a transmit axis, while the target scene is imaged onto the array along a receive axis, which is offset transversely relative to the transmit axis, and adjusting the membership includes changing the membership so as to compensate for a parallax between the transmit and receive axes as a function of the distance.

The present invention will be more fully understood from the following detailed description of the embodiments thereof, taken together with the drawings in which:

DETAILED DESCRIPTION OF EMBODIMENTS

Overview

Figure 1:
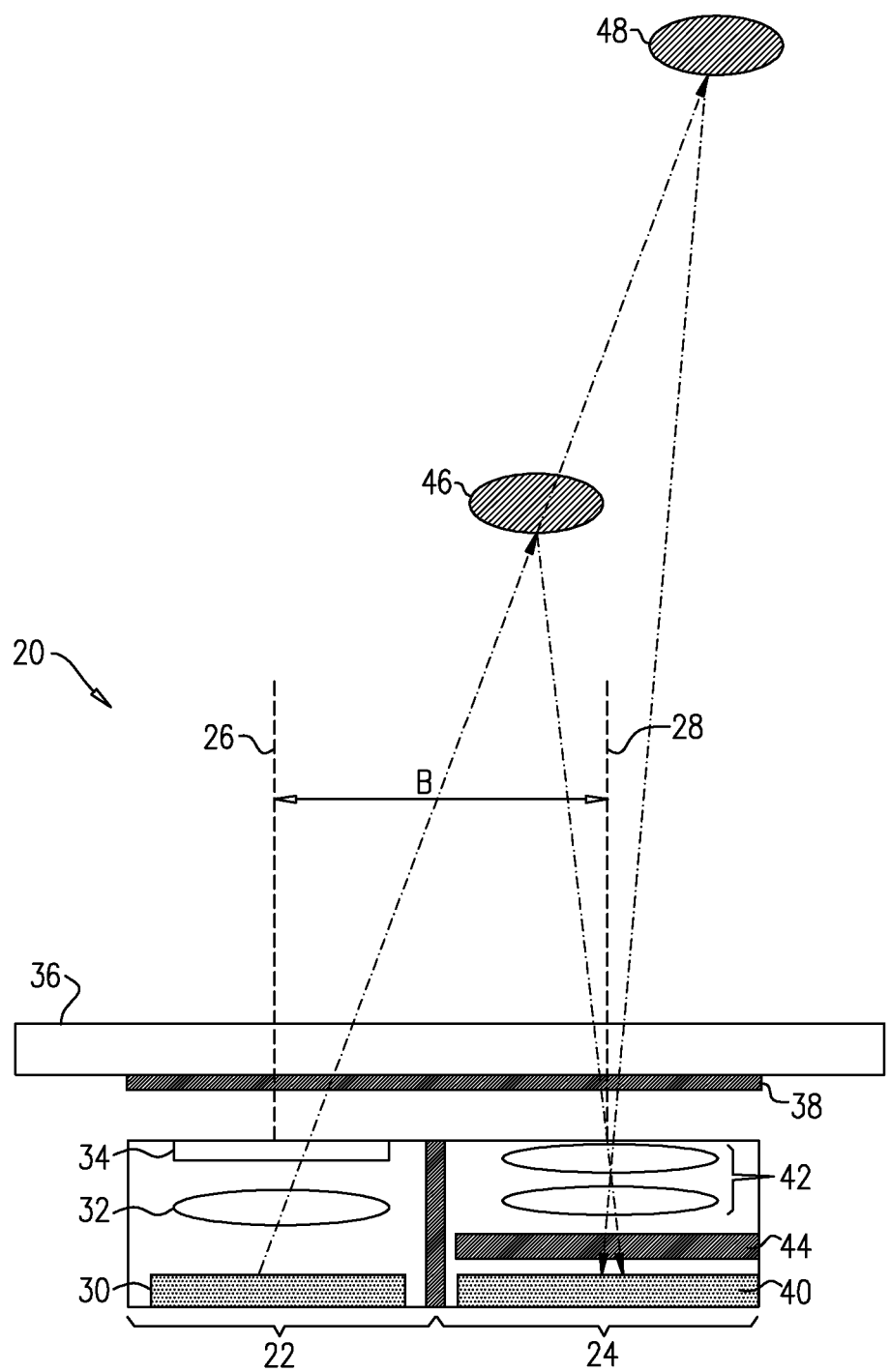
FIG. 1 is a schematic side view of a depth mapping device, in accordance with an embodiment of the invention.

U.S. Patent Application Publication 2017/0176579, whose disclosure is incorporated herein by reference, describes a ToF-based depth mapping system in which echoes of transmitted laser pulses are sensed by a two-dimensional array of single-photon time-sensitive sensing elements, such as SPADs. By addressing each SPAD individually via dedicated control circuitry, the sensitivity, including the on/off-state, of each SPAD is controlled by its specific reverse p-n junction high voltage. At any instant during a scan, only the sensing elements in the area or areas of the array that are to receive reflected illumination from an emitted beam are actuated. The sensing elements are thus actuated only when their signals provide useful information. This approach both reduces the background signal, thus enhancing the signal-to-background ratio, and lowers the electrical power needs of the detector array.

In some embodiments, several SPADs are grouped together into "super-pixels," meaning that these SPADs are actuated at the same time, and the pulses that they generate due to incident photons are binned together for purposes of ToF measurement. The super-pixels that are actuated at any given time are those on which reflected photons from a given transmitted pulse are expected to be incident. Thus, if the transmitted and reflected beams are tightly focused, the reflected pulse will be incident on only a single SPAD or a small group of SPADs, and the super-pixels need comprise only a few adjacent SPADs. On the other hand, when the reflected beam extends over a larger area of the SPAD array, it is advantageous to use larger super-pixels.

If the beam paths of the transmitted and reflected pulses are coaxial, a pulse transmitted in a given angular direction from the ToF-based mapping device will always be reflected back to the same SPAD or group of SPADs in the array, regardless of the distance to the object in the scene from which the pulse is reflected. Such a coaxial arrangement generally dictates the use of a beam combiner, which leads to loss of signal and imposes other design constraints. Therefore, in the embodiments described hereinbelow, the transmitter and the receiver are positioned side by side with an offset between their respective optical axes.

The offset between the transmitter and receiver, however, gives rise to issues of parallax: The SPAD or group of SPADs that receive the reflection of a pulse transmitted in a given angular direction will vary as a function of the distance to the area in the scene on which the pulse is incident. Furthermore, in both non-coaxial and coaxial configurations, the size of the reflected spot on the SPAD array will typically change with distance due to defocusing, and specifically may be larger for nearby objects than for distant objects. To accommodate these distance-dependent changes in the location and size of the reflected spot, it is possible to use large super-pixels, which will capture substantially all reflected photons regardless of the distance to the object. This approach, however, increases both the power consumption and the noise generated in the SPAD array, since a substantially larger number of SPADs are actuated than are actually needed to receive all the reflected photons from the object at any given distance. This problem is particularly acute for distant objects, from which the reflected light signals are relatively weak.

Embodiments of the present invention that are described herein address this problem by providing dynamic super-pixels, which change their configuration depending on distance to the target scene. Thus, the location of the super-pixel that is to receive reflected light from a beam transmitted at a given angle is selected, and can shift, so as to accommodate the effect of parallax as a function of object distance. Additionally or alternatively, the size of the super-pixel is set, and may increase or decrease, in order to handle changes in the reflected spot size.

The disclosed embodiments provide an optical sensing device, which comprises a light source and an array of sensing elements. The light source emits one or more beams of light pulses at respective angles toward a target scene, and light collection optics image the target scene onto the array of sensing elements, which output signals in response to incident photons. In the embodiments described below, the light source comprises an array of emitters, but the principles of the present invention may alternatively be applied, mutatis mutandis, to scanned beams, as in the above-mentioned U.S. Patent Application Publication 2017/0176579.

Control circuitry actuates the sensing elements only in one or more selected regions of the array, which are defined as super-pixels. Each such super-pixel contains a respective set of the sensing elements in a part of the array onto which the light collection optics image a corresponding area of the target scene that is illuminated by one of the emitted beams. The control circuitry adjusts the membership of the set of sensing elements depending upon the distance of the corresponding area from the device. In some embodiments, these adjustments include enlarging and shrinking the selected region of the array, such that the super-pixel may contain a larger number of the sensing elements when the corresponding area is close to the device than when the corresponding area is far from the device.

Additionally or alternatively, in some embodiments, the super-pixel boundaries are set and may be shifted to take parallax into account, due to the transverse offset of the receive axis of the light collection optics relative to the transmit axis of the light source. (As noted above, the offset between the transmit and receive axes causes the image of the area of the scene corresponding to a given super-pixel to shift transversely with the distance of the area from the device.) In some embodiments, the control circuitry shifts the boundaries of the super-pixels in order to compensate for this parallax, for example by setting and shifting the boundaries of the super-pixel depending on the distance of the corresponding area from the device. In other embodiments, the boundaries of the super-pixels are set so as to contain the image cast onto the array when the area corresponding to the super-pixel is at the maximal range from the device, while containing only a part of the image cast onto the array when the corresponding area of the scene is at the minimal range (where it is expected that the signals output by the array will be stronger anyway).

System Description

FIG. 1 is a schematic side view of a depth mapping device 20, in accordance with an embodiment of the invention. Device 20 comprises a transmitting (Tx) laser projector 22 and a receiving (Rx) camera 24, with respective optical axes 26 and 28 that are offset transversely by a baseline offset B, as shown in the figure.

Tx laser projector 22 comprises an array 30 of emitters, such as a monolithic array of vertical-cavity surface-emitting lasers (VCSELs), which concurrently emit respective beams of light pulses. Collimating optics 32 project these beams at different, respective angles, toward corresponding areas of a target scene. To increase the number of projected beams in the pictured embodiment, a diffractive optical element (DOE) 34 splits the projected beam pattern into multiple adjacent or overlapping copies, thus creating a denser pattern of spots extending over the target scene. A cover window 36 of the device includes a filter 38, for example an infrared (IR) filter, in order to prevent light outside the optical working range from exiting and entering the device.

Rx camera 24 comprises an array 40 of sensing elements, which output signals in response to incident photons. In the present embodiment, the sensing elements comprise SPADs, or possibly another type of single-photon detector, so that the output signals are indicative of respective times of arrival of photons on the sensing elements. Light collection optics 42 image the target scene onto the SPAD array, while a bandpass filter 44 blocks incoming light that is outside the emission band of the Tx laser projector.

Each of the beams emitted by Tx laser projector 22 illuminates a corresponding area of the target scene, and light collection optics 42 image this area onto a certain, respective region of SPAD array 40. Control circuitry (shown in FIG. 2) actuates respective sets of the SPADs only in these particular regions, as explained above, and in some circumstances selects the membership of these sets depending upon the distance of the corresponding area of the target scene from the depth mapping device. These distances typically vary over a certain design range, from a predefined minimum to a predefined maximum, over which the device is expected to be able to make depth measurements.

The selection of member SPADs can take into account, inter alia, the parallax due to the offset between Tx and Rx axes 26 and 28. As explained earlier, this parallax causes the region of SPAD array 40 onto which the spot due to a given laser beam is imaged to shift transversely in dependence upon the distance to the area of the target scene that is illuminated by the beam. This parallax shift is illustrated, for example, by the beams that are reflected from a near object 46 and a distant object 48 in FIG. 1. Details of some methods and criteria that can be applied in selecting the SPADs to actuate are presented with reference to the figures that follow.

Although the embodiments shown in the figures and described herein refer to the particular design of depth mapping device 20, the principles of the present invention may similarly be applied, mutatis mutandis, to other sorts of optical sensing devices that use an array of sensing elements, for both depth mapping and other applications. For example, Tx laser projector 22 may comprise a scanner, which scans a single beam or an array of multiple beams over the target scene. As another example, Rx camera 24 may contain detectors of other sorts, which may detect reflected light intensity in addition to or instead of time of flight. Furthermore, some of the distance-based adjustments of super-pixel boundaries that are described herein are also applicable to devices in which the Tx laser projector and the Rx camera are coaxial (with a suitable beam combiner, for example). All such alternative embodiments are considered to be within the scope of the present invention.

Figure 2:
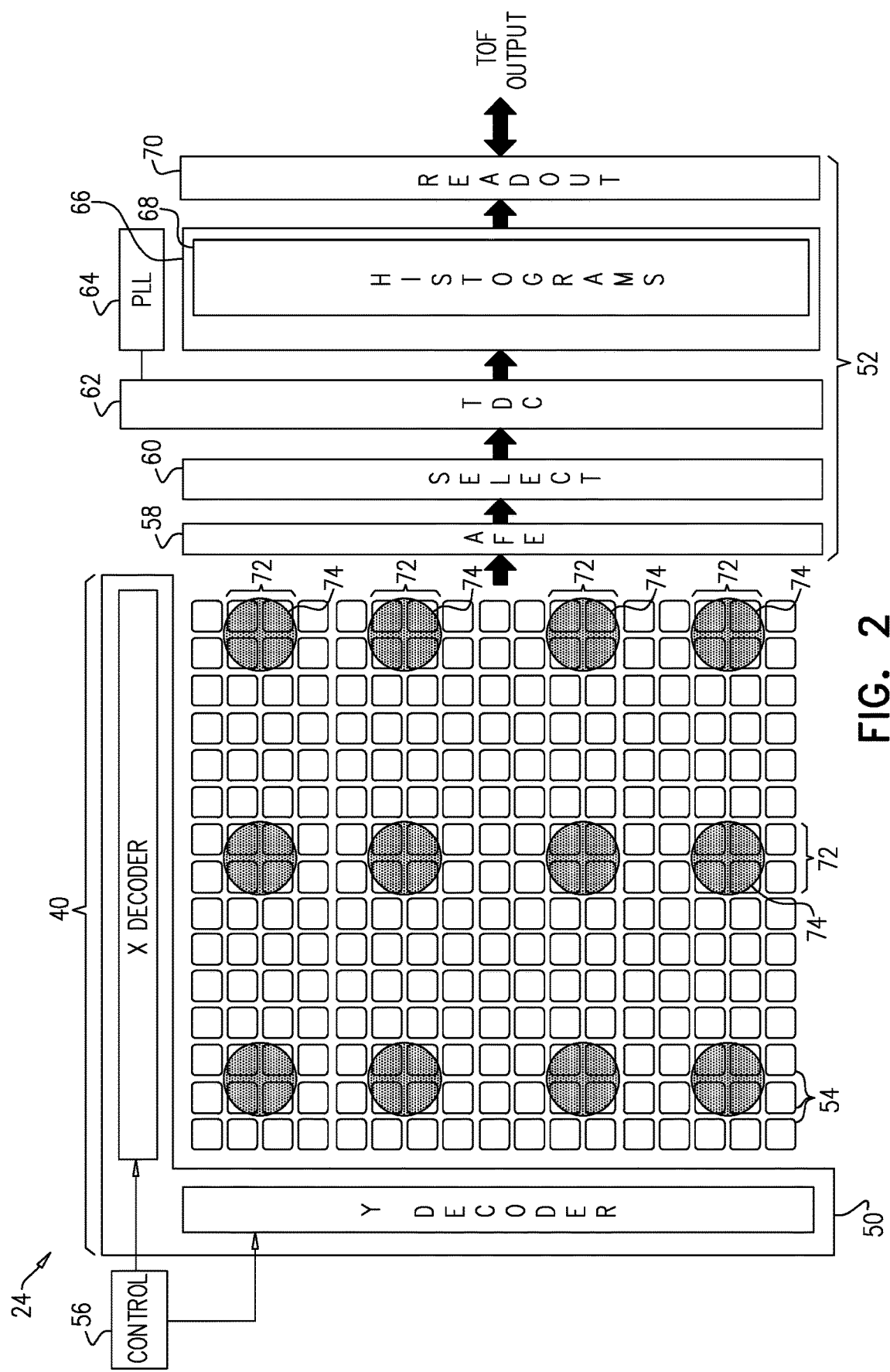
FIG. 2 is a block diagram that schematically illustrates a ToF detection array, in accordance with an embodiment of the invention.

FIG. 2 is a block diagram that schematically shows details of Rx camera 24, in accordance with an embodiment of the invention. In this embodiment, SPAD array 40 includes integrated addressing logic 50, as well as processing circuits 52. Circuits of this sort are described, for example, in the above-mentioned U.S. Patent Application Publications 2017/0052065 and 2017/0176579, as well as in U.S. Patent Application Publication 2017/0179173, whose disclosure is also incorporated herein by reference.

SPAD array 40 in the pictured embodiment comprises an addressable matrix of 170×130 SPADs 54. Control circuitry 56 interacts with X- and Y-addressing logic 50 to select the SPADs 54 that are to be actuated at any given time. The selected SPADs are turned on, for example by setting the bias voltages appropriately, so as to emit pulses in response to incident photons, while the remaining SPADs are deactivated. The pulses are amplified and shaped by an analog front end (AFE) 58, operating in a number of parallel channels (135 channels in the present example, each serving a super-pixel comprising four active SPADs). Selection logic 60 connects the AFE channels to respective time-to-digital converters (TDC) 62, which output digital values indicative of the times of arrival of the pulses, synchronized by a phase-locked loop (PLL) 64.

A histogram builder 66 collects a histogram 68 of the digital values from each TDC channel over a series of transmitted pulses. Based on these histograms, a readout (R/O) circuit 70 outputs a ToF value for each super-pixel (given by the mode of the histogram, for example), thus defining a depth map of the target scene. Alternatively or additionally, processing circuits 52 may fully output raw histograms for each super-pixel for further processing in the control circuitry, or elsewhere in the system. When multiple SPADs 54 are binned together into a super-pixel, the ToF of each detected photon from any SPAD in the super-pixel feeds into a common histogram builder circuit. The ToF value in this case will represent an average time of flight of the signal photons over the SPADs in this set. The ToF values, as well as other features of the signals output by the active SPADs, may be fed back to control circuitry 56 for use in subsequent adjustments.

Control circuitry 56 selects the set of SPADs 54 to actuate in each super-pixel 72 and adaptively adjusts this set, thus setting and shifting the super-pixel boundaries. Collection optics 42 in Rx camera 24 image the area illuminated by each transmitted laser spot onto a certain, respective region 74 of SPAD array 40, as illustrated in FIG. 2. (It is assumed in this figure that the areas illuminated by the spots are at equal, relatively large distances from depth mapping device 20.) Thus, in FIG. 2, the active SPADs 54 selected by control circuitry 56 are those onto which the laser spots are imaged, so that each super-pixel 72 includes a set of 2×2 SPADs. Control circuitry 56 is able to adjust the super-pixel boundaries in response to the respective distances of the illuminated areas from the depth mapping device, meaning that in practice, at any given point in time, some of the super-pixels may be larger than others and/or may have their boundaries shifted transversely relative to the situation shown in FIG. 2.

Super-Pixel Selection and Control

Figure 3:
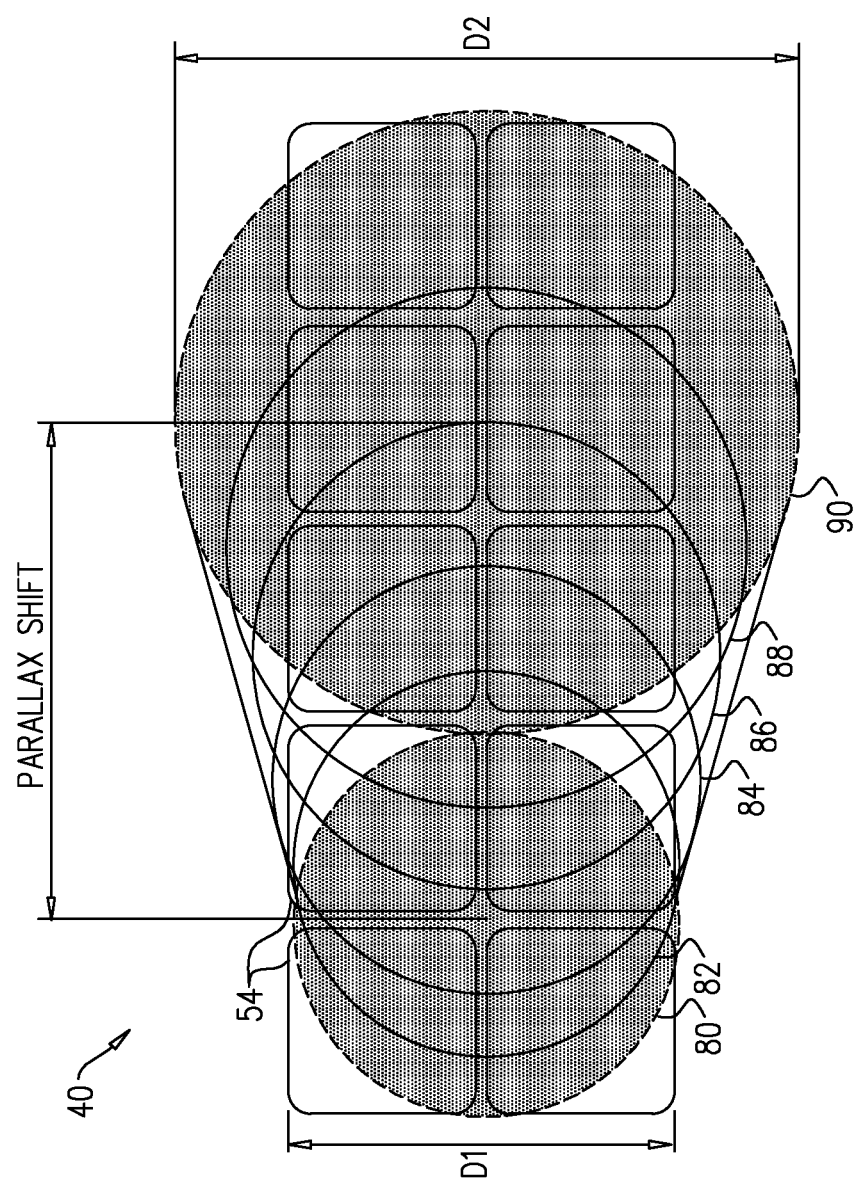
FIG. 3 is a schematic frontal view of reflected laser spots imaged only elements of a SPAD array, in accordance with an embodiment of the invention.

FIG. 3 is a schematic frontal view of reflected laser spots 80, 82, 84, 86, 88, 90 imaged from an area of a target scene onto SPADs 54 in array 40, in accordance with an embodiment of the invention. This figures shows the effects of parallax and defocus on the size and location of the region of the SPAD array onto which the spot produced by a given laser beam is imaged by collection optics 42, as a function of the distance of the area of the target scene illuminated by the laser beam from the depth mapping device. It assumes a certain baseline offset (B) between Tx and Rx axes 26 and 28 (FIG. 1). The "pixels" in the figure correspond to individual SPADs 54 in the array. The distance to the target scene can vary over a range up to two orders of magnitude.

Spot 80, at the left side of FIG. 3, represents the image formed on SPAD array 40 when the laser beam is incident on an area of the target scene 5 m away from depth mapping device 20; whereas spot 90 at the right side represents the image when the beam is incident on an area only 15 cm away. Spot 80 covers a region roughly two pixels in diameter ($D_1$), while spot 90 covers a region almost three pixels in diameter ($D_2$), due to defocus (blurring) of the image by collection optics 42. At the same time, the center of spot 90 has shifted relative to spot 80 by about 2.5 pixels due to parallax. These specific results are a function of the optical properties and geometrical dimensions of a specific depth mapping device, but the principles of defocus and shift will apply to other depth mapping devices of similar configuration.

To deal with the defocus effect, control circuitry 56 may enlarge the super-pixels that receive light from areas of the target scene at short distances. Thus each such super-pixel will contain a larger number of SPADs 54 when the corresponding area of the target scene is close to depth mapping device 20 than when the corresponding area is far from the device.

Alternatively, the relatively small size of super-pixels 72 may be maintained regardless of distance, so that the size of the super-pixel is sufficient to contain the image of the illumination spot that is cast onto the array by the collection optics from distant objects (for example, 2×2 pixels) but smaller than the larger (defocused) image that is cast onto the array from nearby objects. Because nearby objects generally return a much larger flux of photons from the laser beam back onto SPAD array 40, the use of the smaller super-pixel will still give adequate signals at short range, while minimizing the background noise in the weaker signals collected at long range. On this basis, control circuitry 56 may even set the super-pixel boundaries statically, without actively accommodating for parallax effects, so as to contain all of the image of the illumination spot cast from distant objects while containing only a part of the image cast from nearby objects.

Figure 4A:
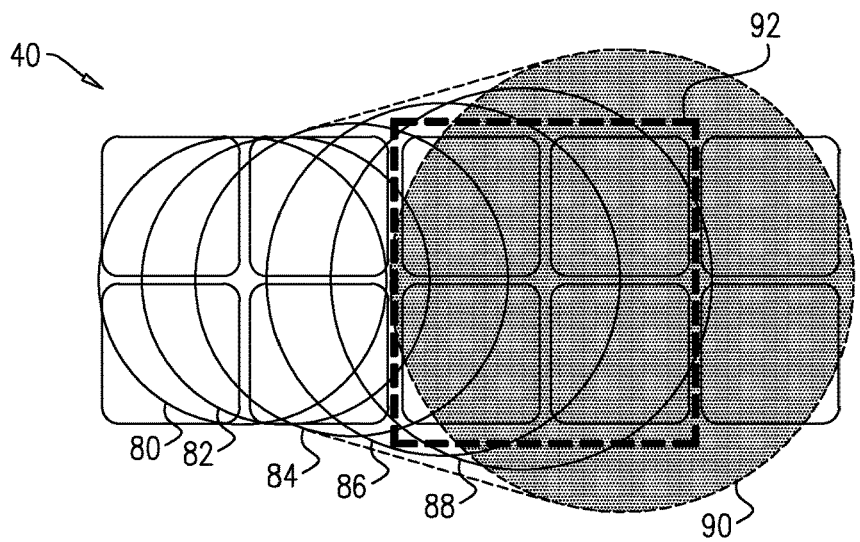
FIGS. 4A-C are schematic frontal views of a sequence of super-pixels defined in operation of a ToF detection array, in accordance with an embodiment of the invention.
Figure 4B:
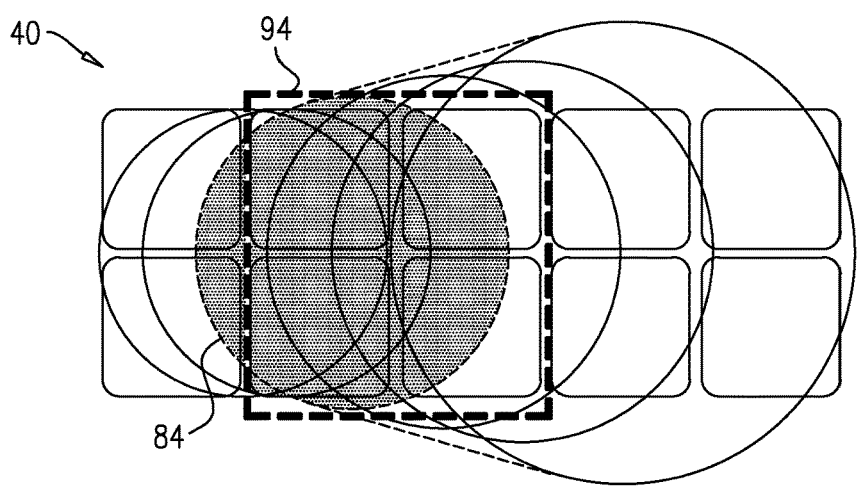
Figure 4C:
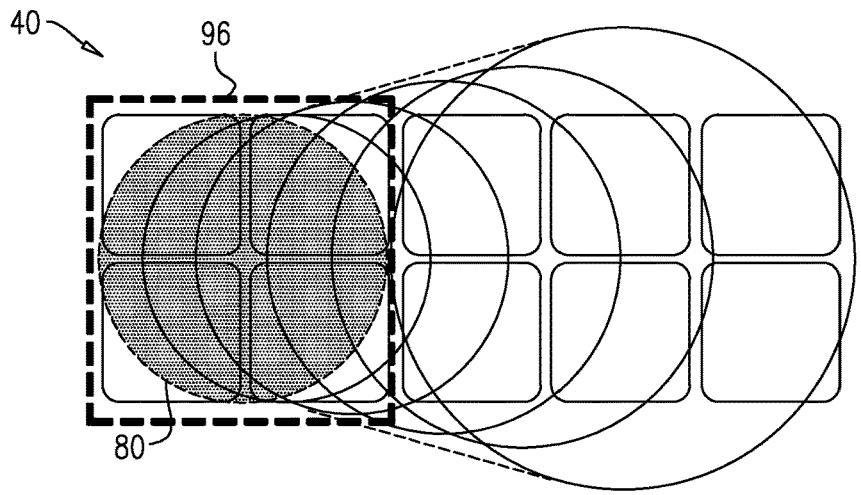

FIGS. 4A-C are schematic frontal views of a sequence of super-pixels 92, 94, 96 defined in operation of SPAD array 40, in accordance with an embodiment of the invention. These figures, as well as FIGS. 5A-C, exemplify methods by which control circuitry 56 shifts the super-pixel boundary dynamically in order to compensate for the shift of the image of the laser spot with distance to the corresponding area of the target scene, due to the parallax effect explained above. In this example, the location of the super-pixel shifts as a function of the distance from super-pixel 92 (FIG. 4A) for nearby areas, through super-pixel 94 at an intermediate distance (FIG. 4B), to super-pixel 96 for distant objects (FIG. 4C).

Since the shift in spot position due to parallax is deterministic as a function of range, control circuitry 56 can reliably change the super-pixel boundary as a function of the measured ToF. The boundary of each super-pixel can be incremented in a number of discrete steps, as illustrated in FIGS. 4A-C, to the location that gives the best signal for the super-pixel in question. Thus, for example, super-pixel 92 may be used for ToF<2 ns (targets closer than 30 cm); super-pixel 94 for 2 ns<ToF<10 ns (targets between 30 cm and 1.5 m from device 20); and super-pixel 96 for ToF>10 ns (targets at 1.5 m and beyond).

Figure 5A:
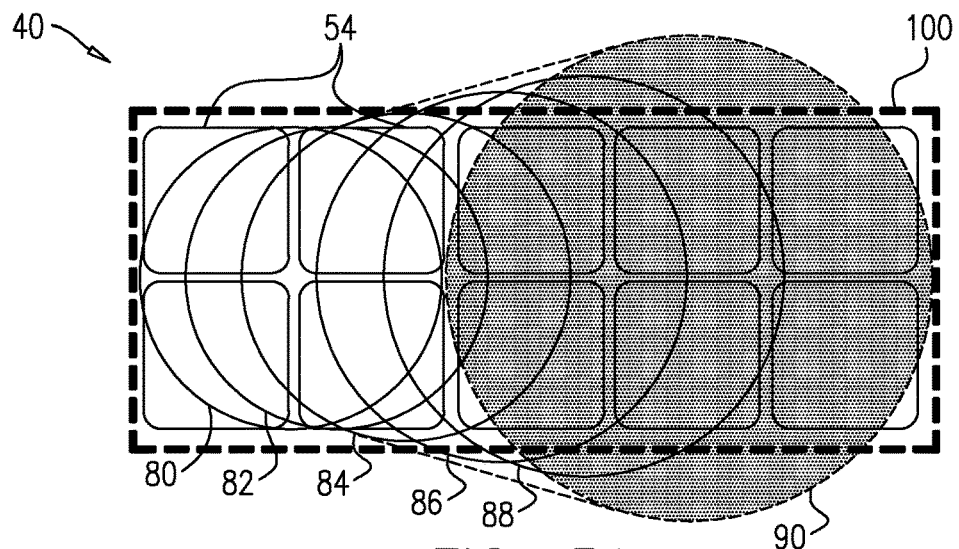
FIGS. 5A-C are schematic frontal views of a sequence of super-pixels defined in operation of a ToF detection array, in accordance with another embodiment of the invention.
Figure 5B:
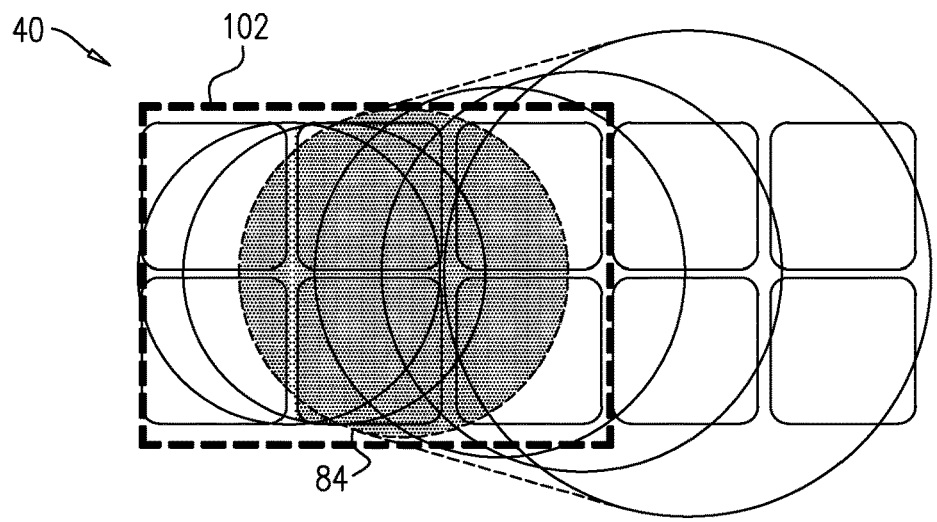
Figure 5C:
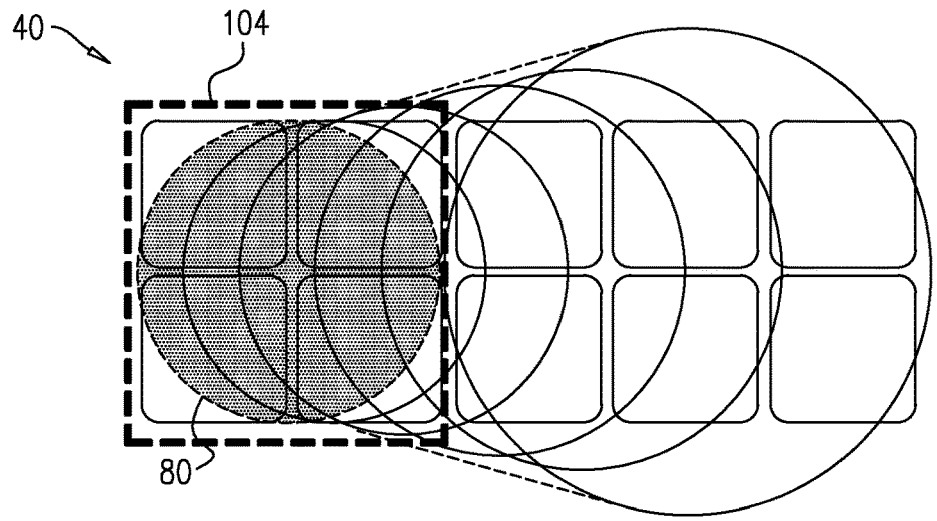

FIGS. 5A-C are schematic frontal views of a sequence of super-pixels 100, 102, 104 defined in operation of SPAD array 40, in accordance with another embodiment of the invention. In this embodiment, control circuitry 56 initially sets the super-pixel boundary to the large size of super-pixel 100, which is capable of capturing photons from both nearby and distant areas of the target scene, as illustrated in FIG. 5A. As the target distance increases, control circuitry 56 shifts one edge of the super-pixel boundary (the right edge in the pictured example) to the intermediate size of super-pixel 102, shown in FIG. 5B, so as to reduce background due to unneeded SPADs 54 while still capturing all of the image of the illumination spot. Super-pixel 104 is reduced to minimal size for areas of the target scene that are found to be at large distances from depth mapping device 20, as shown in FIG. 5C.

Although the foregoing figures show certain particular schemes for dynamic adjustment of super-pixel boundaries, alternative schemes will be apparent to those skilled in the art after reading the above description and are considered to be within the scope of the present invention. It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. An optical sensing device, comprising:
   a light source, which is configured to emit one or more beams of light pulses at respective angles toward a target scene;
   an array of sensing elements configured to output signals in response to incidence of photons on the sensing elements;
   light collection optics configured to image the target scene onto the array; and
   control circuitry coupled to actuate the sensing elements only in one or more selected regions of the array, each selected region containing a respective set of the sensing elements in a part of the array onto which the light collection optics image a corresponding area of the target scene that is illuminated by the one of the beams, and to adjust a membership of the respective set responsively to a distance of the corresponding area from the device,
   wherein each selected region has a boundary comprising multiple edges, which contain the respective set of the sensing elements, and wherein the control circuitry is configured to enlarge the selected region of the array responsively to the distance by shifting one edge of the boundary, such that the selected region contains a larger number of the sensing elements when the corresponding area is close to the device than when the corresponding area is far from the device.

2. The device according to claim 1, wherein the signals output by the sensing elements are indicative of respective times of arrival of the photons on the sensing elements, and wherein the control circuitry is configured to process the signals in order to compute an indication of the distance to the corresponding area in the target scene based on the times of arrival.

3. The device according to claim 2, wherein the sensing elements comprise single-photon avalanche diodes (SPADs).

4. The device according to claim 2, wherein the control circuitry is configured to bin together the signals that are output by the sensing elements in the set in order to compute an average time of flight of the photons over the set.

5. The device according to claim 1, wherein the light source comprises a plurality of emitters, which are configured to emit a corresponding plurality of the beams concurrently toward different, respective areas of the target scene.

6. The device according to claim 1, wherein the light source emits the one or more beams along a transmit axis, while the light collection optics image the target scene onto the array along a receive axis, which is offset transversely relative to the transmit axis, and wherein the control circuitry is configured to adjust the membership so as to compensate for a parallax between the transmit and receive axes as a function of the distance.

7. The device according to claim 6, wherein the control circuitry is configured to shift the boundary of each selected region of the array responsively to the distance in order to compensate for the parallax.

8. The device according to claim 1, wherein the device is configured to sense the photons received from the target scene over a range of distances from a minimal range to a maximal range, and wherein the control circuitry is configured to set a size of the one or more selected regions to be sufficient to contain a first image cast onto the array by the light collection optics of the corresponding area of the scene at the maximal range, but smaller than a second image cast onto the array by the light collection optics of the corresponding area of the scene at the minimal range.

9. An optical sensing device, comprising:
   a light source, which is configured to emit one or more beams of light pulses along a transmit axis toward a target scene;
   an array of sensing elements configured to output signals in response to incidence of photons on the sensing elements;
   light collection optics configured to image the target scene onto the array along a receive axis, which is offset transversely relative to the transmit axis; and
   control circuitry coupled to actuate the sensing elements only in one or more selected regions of the array, each selected region containing a respective set of the sensing elements in a part of the array onto which the light collection optics image a corresponding area of the target scene that is illuminated by the one of the beams, while setting a boundary of each selected region responsively to a parallax due to the offset between the transmit and receive axes,
   wherein the boundary of each selected region comprises multiple edges, which contain the respective set of the sensing elements, and wherein the control circuitry is configured to enlarge the selected region of the array responsively to the parallax by shifting one edge of the boundary, such that the selected region contains a larger number of the sensing elements when the corresponding area is close to the device than when the corresponding area is far from the device.

10. The device according to claim 9, wherein the device is configured to sense the photons received from the target scene over a range of distances from a minimal range to a maximal range, such that a first image cast onto the array by the light collection optics of the corresponding area of the scene at the maximal range is shifted transversely, due to the parallax, relative to a second image cast onto the array by the light collection optics of the corresponding area of the scene at the minimal range, and
   wherein the control circuitry is configured to set the boundary of the selected region to contain all of the first image but only a part of the second image.

11. A method for optical sensing, comprising:
   emitting one or more beams of light pulses at respective angles toward a target scene;
   imaging the target scene onto an array of sensing elements configured to output signals in response to incidence of photons on the sensing elements;

actuating the sensing elements only in one or more selected regions of the array, each selected region containing a respective set of the sensing elements in a part of the array onto which a corresponding area of the target scene that is illuminated by the one of the beams is imaged; and adjusting a membership of the respective set responsively to a distance of the corresponding area from the array wherein each selected region has a boundary comprising multiple edges, which contain the respective set of the sensing elements, and wherein adjusting the membership comprises enlarging the selected region of the array responsively to the distance by shifting one edge of the boundary, such that the selected region contains a larger number of the sensing elements when the corresponding area is close to the array than when the corresponding area is far from the array.

12. The method according to claim 11, wherein the signals output by the sensing elements are indicative of respective times of arrival of the photons on the sensing elements, and wherein the method comprises processing the signals in order to compute an indication of the distance to the corresponding area in the target scene based on the times of arrival.

13. The method according to claim 12, wherein processing the signals comprises binning together the signals that are output by the sensing elements in the set in order to compute an average time of flight of the photons over the set.

14. The method according to claim 11, wherein the one or more beams are emitted along a transmit axis, while the target scene is imaged onto the array along a receive axis, which is offset transversely relative to the transmit axis, and wherein adjusting the membership comprises changing the membership so as to compensate for a parallax between the transmit and receive axes as a function of the distance.

15. The method according to claim 14, wherein changing the membership comprises shifting the boundary of each selected region of the array responsively to the distance in order to compensate for the parallax.

16. The method according to claim 15, wherein imaging the target scene comprises sensing the photons received from the target scene, using the array of sensing elements, over a range of distances from a minimal range to a maximal range, such that a first image cast onto the array of the corresponding area of the scene at the maximal range is shifted transversely, due to the parallax, relative to a second image cast onto the array of the corresponding area of the scene at the minimal range, and wherein shifting the boundary comprises setting the boundary of the selected region to contain all of the first image but only a part of the second image.

17. The method according to claim 11, wherein imaging the target scene comprises sensing the photons received from the target scene, using the array of sensing elements, over a range of distances from a minimal range to a maximal range, and wherein adjusting the membership comprises setting a size of the one or more selected regions to be sufficient to contain a first image cast onto the array of the corresponding area of the scene at the maximal range, but smaller than a second image cast onto the array of the corresponding area of the scene at the minimal range.

* * * * *